United States Patent [19]

Gewartowski et al.

[11] 3,820,041

[45] June 25, 1974

[54] RESONANCE CONTROL IN INTERDIGITAL CAPACITORS USEFUL AS DC BREAKS IN DIODE OSCILLATOR CIRCUITS

[76] Inventors: James Walter Gewartowski, 2908 Edgewood, Allentown, Pa. 18103; Isamu Tatsuguchi, R.D. 1 Chestnut Hill Rd., Center Valley, Pa. 18034

[22] Filed: Oct. 4, 1973

[21] Appl. No.: 403,720

Related U.S. Application Data

[62] Division of Ser. No. 283,984, Aug. 28, 1972, Pat. No. 3,764,938.

[52] U.S. Cl. .......................... 333/1.1, 331/76, 331/77, 333/24 C, 333/84 M

[51] Int. Cl. ...... H01p 1/32, H01p 3/08, H03h 13/00

[58] Field of Search ................ 333/1.1, 24 C, 84 M; 331/76, 77

[56] References Cited

UNITED STATES PATENTS 3,784,937 1/1974 Jackson et al. .................... 333/84 M

*Primary Examiner*—Archie R. Borchelt
*Assistant Examiner*—Marvin Nussbaum
*Attorney, Agent, or Firm*—David L. Hurewitz

[57] ABSTRACT

A modified stripline interdigital capacitor has slots coupled into the capacitor gap. These slots provide reactive loading to the slot transmission line formed by the gap. They are positioned and dimensioned to shift the frequency of the slot line resonance so that it is out of a selected frequency band without affecting the capacitance of the structure. This interdigital structure may be used in diode oscillator circuits to provide a dc block for isolating the input and output from the diode bias.

10 Claims, 8 Drawing Figures

RESONANCE CONTROL IN INTERDIGITAL CAPACITORS USEFUL AS DC BREAKS IN DIODE OSCILLATOR CIRCUITS

This application is a division of application Ser. No. 283,984, filed Aug. 28, 1972.

BACKGROUND OF THE INVENTION

This invention relates to microwave integrated circuitry, especially interdigital capacitor bias breaks for diode amplifiers and oscillators, and more particularly to stripline interdigital capacitors having resonance control capability.

In recent years, diodes and particularly impact avalanche transit time (IMPATT) diodes have been used as the basis for solid-state oscillators and amplifiers in numerous microwave applications. The diode bias must, of course, be isolated from the remainder of the circuit, and the necessary dc breaks have been provided by chip capacitors. Alternatively, a stripline interdigital capacitor may be used where the circuitry includes any type of strip transmission line; as used herein, any transmission line structure, such as stripline or microstrip, which includes a flat conductor and at least one separated ground plane will be referred to as a strip transmission line or stripline.

The stripline conductor is split into two sections to form the interdigital capacitor. Each section has a set of conductive fingers (normally rectangular in shape) protruding from one end. The sections are positioned on a substrate so that the fingers of one section are interdigitated with the fingers of the other, and the two sections are separated by a continuous dielectric (of air or other material). The protruding fingers serve as opposing electrodes and the serpentine region between them is the capacitor gap.

The capacitor must be impedance-matched to the circuit over the operating frequency band so that it is electrically transparent, and since the capcitance is inversely related to the reactance, a higher capacitance makes the required matching over a broadband frequency range easier than with a lower capacitance. Unfortunately, the interdigital structure normally exhibits a very small total capacitance — on the order of a few pF. It can be increased by decreasing the gap width and/or by increasing the gap length, but for practical reasons, dictated by the materials and processes, the gap width cannot be decreased indefinitely without producing a dc path, and while the gap length can be increased, the capacitor gap acts as an open circuited slot line which produces slot line resonance whenever the gap length (corrected for the susceptive loading at the bends) is a multiple of one-half of a wavelength. Accordingly, the longer the gap, the lower and more closely spaced are the spurious resonant frequencies which the gap will support, and more likely that undesirable resonances will fall within the operating frequency band of the device.

It is the principal object of the present invention to provide a stripline interdigital capacitor which is free of spurious resonance within a selected operating frequency band. It is also an object to control the resonance frequency of a stripline interdigital capacitor independent of the capacitance of the structure. It is a further object to provide a bias break for a diode-type oscillator or amplifier in which spurious resonances are eliminated from the device's operating frequency band.

SUMMARY OF THE INVENTION

In accordance with the present invention, the conventional stripline interdigital capacitor is modified so that the resonant frequencies produced by the capacitor's gap can be controlled and with proper dimensioning the resonance may be effectively eliminated from a selected operating frequency band. The resonance control may be provided by the addition of a slot or a number of slots cut into the conductor. This slot acts to extend the effective length of the capacitor's gap by reactively loading the gap so that while it will have no substantial effect upon the capacitance of the device nor upon the impedance characteristic, it will act to lower the resonant frequencies. The shifting of the resonance is best accomplished if the slots are located at voltage minima of the resonance wave, that is, at the nodes of the standing wave pattern. For half-wave resonance, a node is located at the midpoint of the gap length, and full-wave resonance exhibits nodes symmetrically displaced from the midpoint. Accordingly, to shift half-wave resonant frequencies, a slot is placed in one conductor section on the center line of the conductor, and to shift full-wave resonant frequencies, a pair of slots are symmetrically located off the center line.

The resonance-controlled interdigital capacitors find application as dc bias breaks in diode-type oscillators and amplifiers. In such a circuit utilizing, for example, a three-port circulator, the interdigital structure provides the dc block between the diode arm and the input and output arms and it is designed so that the resonance is outside the operating band of the oscillator. The oscillator circuit may utilize a pair of interdigital capacitors having different resonant frequencies, such as one in the input arm having appropriate slotting so that the closest resonant frequency is below the operating band and another in the output arm dimensioned to have the closest resonance above the band. Since the resonant frequencies are different, the associated energy can be harmlessly terminated in a conventional manner. Alternatively, a single capacitor, with an appropriate slotted structure providing reactive loading, may be placed in the diode arm.

DETAILED DESCRIPTION

Figure 1:
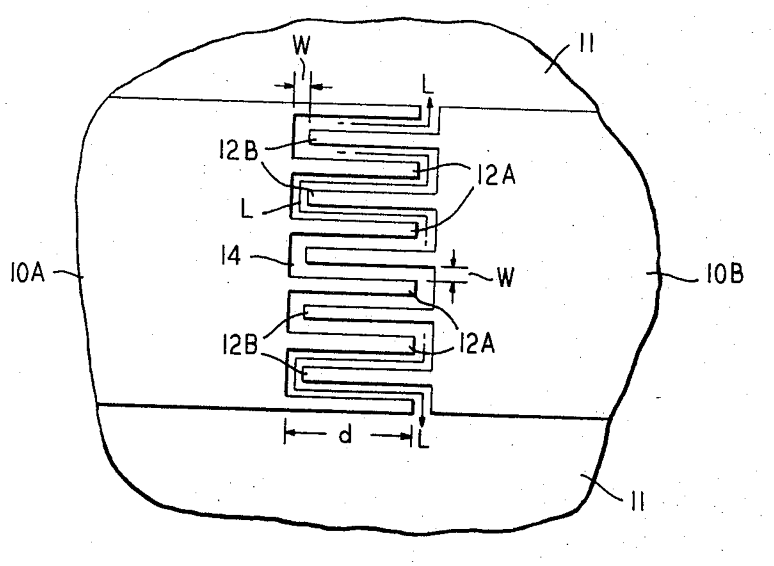
FIG. 1 PRIOR ART
FIG. 1 is a plan view of the conventional stripline interdigital capacitor.

FIG. 1 illustrates the conductor pattern of a conventional stripline interdigital capacitor. The conductor consists of two sections, 10A and 10B, mounted on substrate 11. Each section has fingers 12A and 12B extending from the body of conductor sections 10A and 10B, respectively, toward the other section. The serpentine space between fingers 12A and 12B is the capacitor gap 14. Its width W is on the order of a few mils and its circuitous length L is determined by the lengths and the number of fingers 12. The capacitor may be covered with any appropriate dielectric, to prevent the entry of extraneous material onto the gap.

The capacitance of the structure is a function of its dimensions. The incremental capacity is dependent essentially upon the fringing capacity which is determined by the gap width W, and the total capacitance is the product of the incremental capacity and the gap length L. The total capacitance can be increased by decreasing the gap width W, but this is limited in the extreme by the materials and processes being used. Alternatively, the capacitance can be increased by increasing the finger length $d$, or by adding fingers, but since the gap acts as a resonant slot transmission line, the longer gap will support a lower primary resonance frequency and hence the likelihood of a resonant frequency falling within the selected frequency band is increased.

Figure 2:
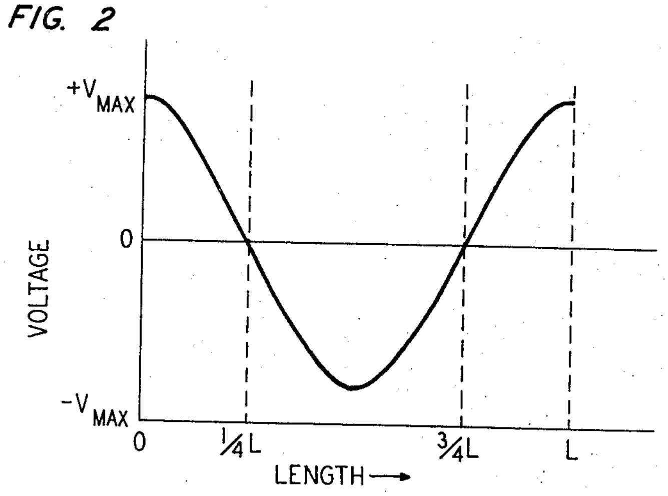
FIGS. 2 and 3 are plots of voltage vs. capacitor gap length for full-wave and half-wave resonance respectively, helpful in explaining the invention.
Figure 3:
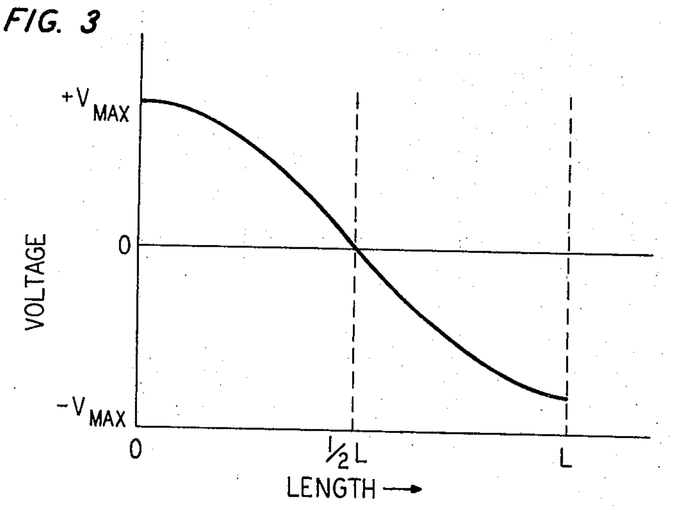

The resonances exist at frequencies for which the length L of the gap is a multiple of one-half of a wavelength. The cosine wave of FIG. 2 illustrates the voltage wave pattern of full-wave resonance in a transmission line of length L. The maxima occur at the ends of the line at O and L with nulls at one-quarter L and three-quarters L. FIG. 3 illustrates the voltage wave pattern of half-wave resonance with the maxima at O and L, and a null at one-half L.

The resonant frequency $f_r$ is determined by $$f_r = nv/2L \quad (1)$$

where $n$ is an integer depending upon the order of the resonance and $v$ is the velocity of propagation along the slot transmission line. For full-wave resonance, $n$ is even and for half-wave resonance, $n$ is odd; hence, $n = 2$ for the primary full-wave resonance and $n = 1$ for the primary half-wave resonance.

As an example, with the dielectric constant of air, $v = 3 \times 10^{10}$ cm/sec. Accordingly, for a very short length L, such as 1 cm, the primary half-wave resonant frequency will be at 15 GHz, and the lowest full-wave resonant frequency will be 30 GHz. A capacitor having this gap length will thus provide no resonance problems if operation is below 15 GHz. However, the slot length of only 1 cm will produce such a small capacitance as to be useless for most applications.

For a longer gap length such as 10 cm, the primary half-wave resonance will occur at 1.5 GHz, the primary full-wave resonance at 3 GHz, and higher order resonances at successive intervals of 1.5 GHz. The following chart shows the primary and second order half-wave and full-wave resonances for an exemplary selection of gap lengths L:

| | Resonant Frequencies — GHz | | | |
|---|---|---|---|---|
| Gap Length L | Primary Half-Wave ($n$=1) | Primary Full-Wave ($n$=2) | Second Order Half-Wave ($n$=3) | Second Order Full-Wave ($n$=4) |
| 20 cm | 0.75 | 1.5 | 2.25 | 3.0 |
| 10 cm | 1.5 | 3 | 4.5 | 6 |
| 5 cm | 3 | 6 | 9 | 12 |
| 1 cm | 15 | 30 | 45 | 60 |

As can be seen, the shorter gap lengths produce higher frequency resonance so that operation in frequency bands below the lowest resonance is possible. For longer gap lengths, the resonant frequencies are lower and more closely spaced so that operating frequency bands must normally be located between resonances. In practical structures the dielectric loading reduces the value of $v$ and the resonant frequencies are proportionately reduced.

By properly selecting the gap length L of the structure of FIG. 1, a selected frequency band may be made free of resonance. However, using this technique (normally changing the number or size of fingers 12) to control the resonant frequency has the disadvantage of also affecting the capacitance of the structure since the total capacitance is dependent upon the length L.

Figure 4:
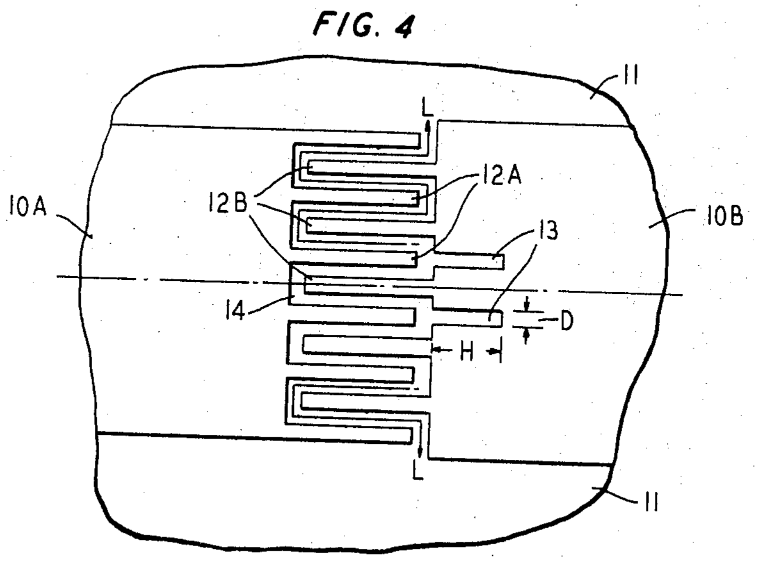
FIG. 4 is the plan view of the interdigital capacitor having resonance frequency control capability in accordance with the invention.

FIG. 4 illustrates an interdigital structure in which resonance is controlled independent of capacitance in accordance with the invention. Conductor 10 is arranged with interdigitated fingers 12A and 12B as in FIG. 1 and the gap 14 acts as the slotted transmission line. The capacitance of the device is determined by the actual length L, but without changing the actual length L and hence without affecting the capacitance, the effective gap length may be adjusted by reactively loading the slotted transmission line. This is accomplished by means of a pair of slots 13 cut out of conductor section 10B. The slots which have a height H less than $\lambda/4$, where $\lambda$ is $v/f$, and $f$ is the operating frequency, act essentially as shorted stubs on a transmission line, and they load the slot line as would an inductance in series. Therefore, the addition of slots 13 increases the effective electrical length of gap 14 and as can be seen from Equation (1) and the illustrative chart, this lowers the resonant frequencies.

The degree of reactive loading and hence the amount of resonance frequency shift is controlled primarily by the location of slots 13 along the gap 14, and to a lesser extent by the height H of slots 13. Though the height H is a significant factor in determining the slots' loading effect, the size of the slots is limited by impedance considerations. Since the removal of large amounts of conductive materials from conductor 10 will adversely affect the matching characteristic of the structure, slots 13 are preferably located in the broader section 10B. Conventional transmission line techniques, such as Smith Chart analysis, can be used to explain the effect of the slots 13 for specific combinations of slot location, height H, and width D.

For maximum loading, slots 13 should be coupled into the transmission line at or near voltage null points where the maximum current exists. To shift half-wave resonance, a single loading slot is preferably positioned on the center line of conductor 10 so that it couples at the midpoint of gap length L. The pair of slots 13 shown symmetrically displaced from the center line of conductor 10, are illustrative of an arrangement for shifting full-wave resonances. The voltage nulls appear for the primary full-wave resonance at L/4 and 3L/4 and the second order full-wave resonance will have nulls at 1/8 L, 3/8 L, 5/8 L and 7/8 L so that the location of slots 13 can be selected according to the resonance frequency being shifted. Although the slots may be placed in either sections 10A or 10B or both, and thus may be coupled substantially at any of the selected nulls, symmetry is preferred and impedance matching considerations must also be taken into account when positioning the slots.

By appropriate dimensioning of the fingers, a desired capacitance can be achieved, and by the addition of loading slots, the resonance frequencies can be shifted downward without affecting the capacitance. Having removed the interdependence of capacitance and resonance, an interdigital capacitor can be optimized so that it becomes a practical dc bias break for microwave circuitry.

Figure 5:
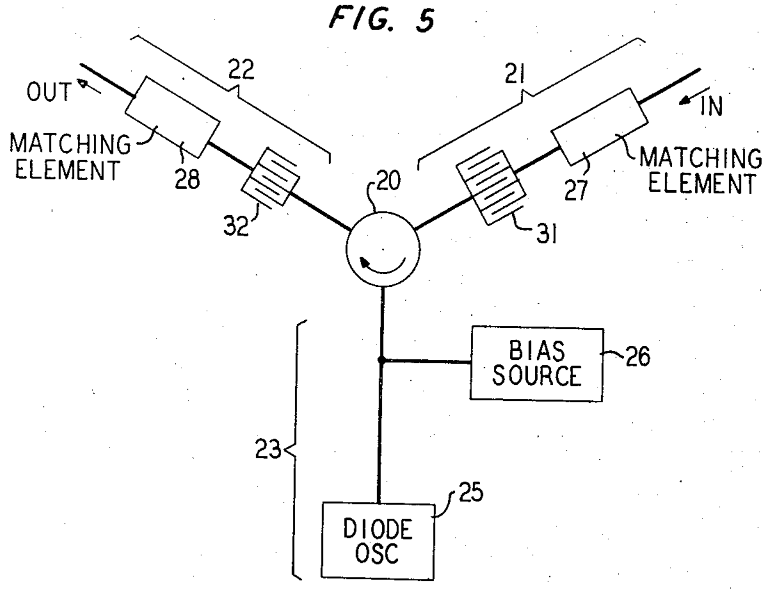
FIGS. 5 and 6 are schematic representations of diode oscillator circuits employing the interdigital capacitor in accordance with the invention.
Figure 6:
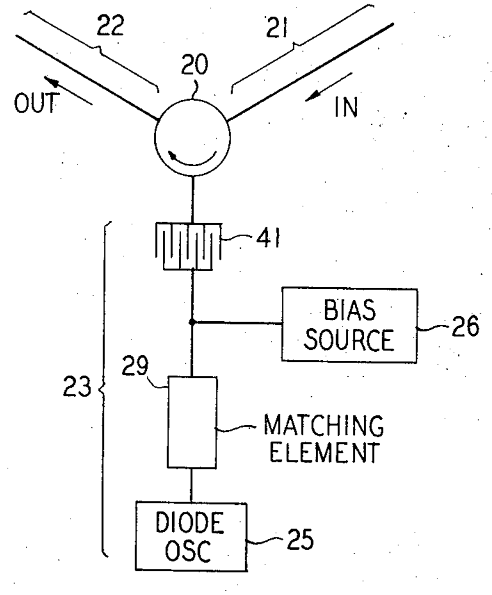

The block diagrams of FIGS. 5 and 6 illustrate two alternative locations for stripline interdigital capacitors used as bias breaks in diode oscillators. The circuit may be, for example, an injection-locked amplifier in which a diode oscillator is injection-locked to the input signal so that the output frequency is determined by the input frequency and the output power is dependent upon the oscillator output. Circulator 20 couples input arm 21 to diode arm 23 and couples diode arm 23 to output arm 22 in a standard manner. Conventionally, circulator 20 includes a matching network so that each port is matched to a standard impedance such as 50 ohms. Diode oscillator 25 is biased by dc bias source 26 and interdigital capacitors 31 and 32 in FIG. 5 and capacitor 41 in FIG. 6 act as the dc bias blocks. The addition of the capacitors requires impedance matching elements 27, 28 and 29 to match capacitors 31, 32 and 41, respectively, to the rest of their circuits, and in order for these elements to match the impedance over a broad band, the reactance of the capacitors should be as small as possible and thus their capacitance should be as large as possible. As indicated above, the structure of FIG. 4 is particularly well-suited to such an application since it can be designed to exhibit a desired capacitance without causing spurious resonances in the operating band of the device.

Figure 7:
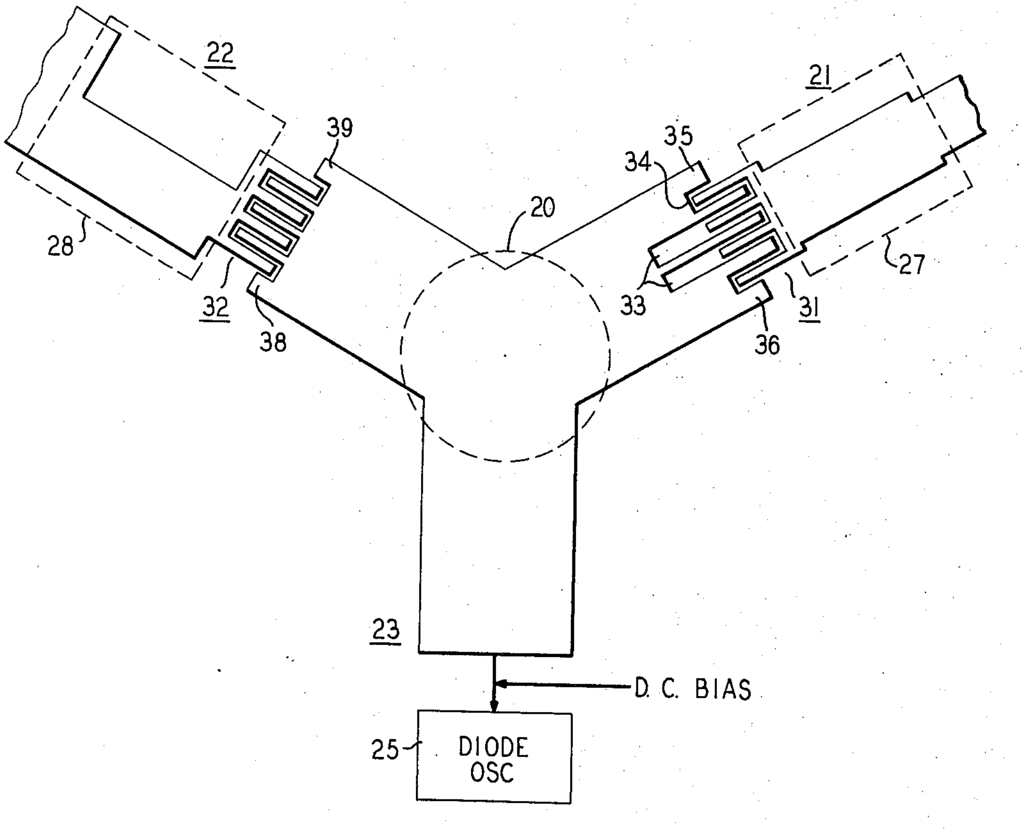
FIGS. 7 and 8 are plan views of conductor patterns corresponding respectively to the circuits of FIGS. 5 and 6.

A conductor layout of the two capacitor configuration of FIG. 5 is shown in FIG. 7. The end fingers 35 and 36 of capacitor 31 are cut short to establish a selected capacitance by delineating the length of gap 34 and this gap length incidentally provides a full-wave resonance assumed to be within the operating frequency band; slots 33 load the gap line to shift this spurious resonance frequency below the operating band. Slots 33 may be on either side of capacitor 31 except that since the conductor on the circulator side is broader, it is preferred because slots cut in that side will have less of an effect on the impedance of the conductor than if the slots were cut into the other side. The additional matching is provided by element 27 which is essentially a section of the conductor appropriately dimensioned in a well-known manner to act as an impedance transformer.

Capacitor 32 is dimensioned to provide a desired capacitance by selection of the finger configuration especially the lengths of end fingers 38 and 39. No slotting is shown since it is assumed that this adjustment of gap length can insure that the resonance is above the operating band, but capacitor 32 may also have loading slots if it is necessary to shift its resonant frequencies. Appropriate dimensioning of the conductor serves as a matching element 28.

If the resonant frequencies generated by capacitors 31 and 32 were the same, reflection would result and the resonance would appear in the diode arm, but since they are at different frequencies, they pass through circulator 20 and can be dissipated in the opposite arms by conventional terminations not shown. The spurious resonances may also be suppressed by the insertion of a lossy material as is disclosed in a copending application of C. E. Barnes Serial No. 283,983, filed August 28, 1972, now U.S. Patent No. 3,764,938, issued October 9, 1973 and assigned to the assignee hereof.

Figure 8:
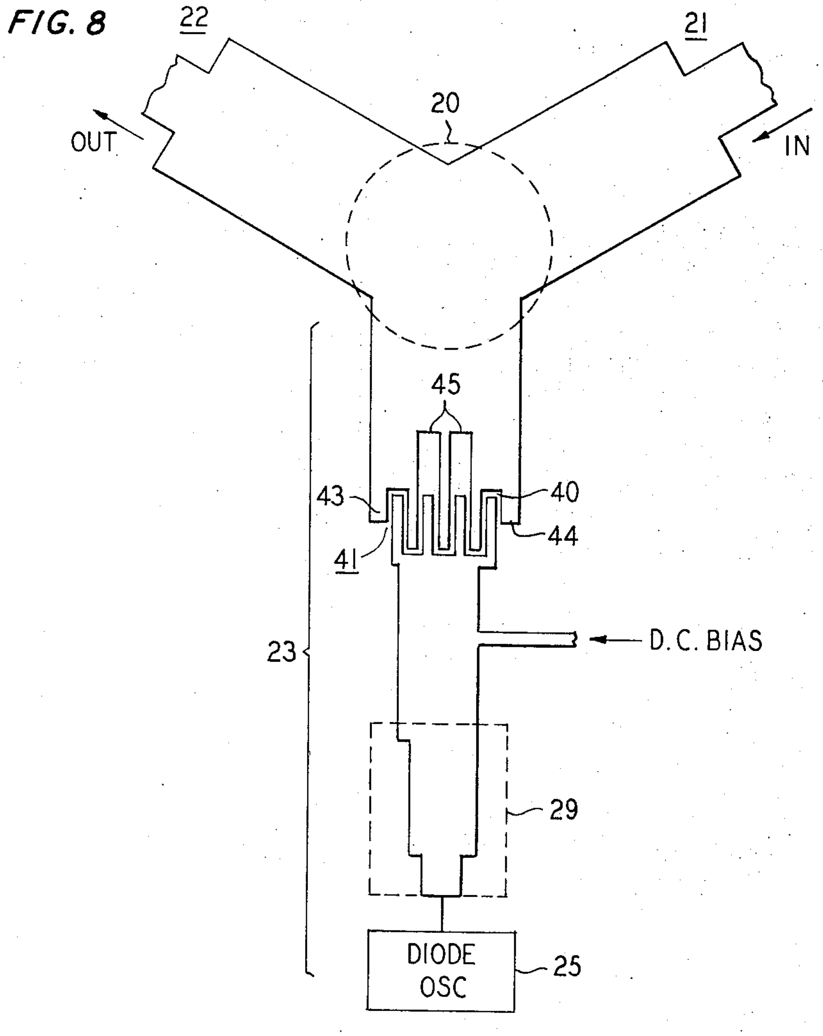

It may be desirable for certain applications to use only a single dc block as shown in FIG. 6 and in the corresponding conductor layout in FIG. 8. Capacitor 41 is shown having the length of its gap 40 established essentially by the lengths of end fingers 43 and 44. This length determines the total capacitance and it is assumed that this slot length gives rise to full-wave resonance within the selected operating band. The off-center slots 45 act to shift the undesired resonance frequency below the lower bound of the operating band. Of course, if the spurious resonances were of the half-wave type, an on-center slot could be used. The suppression technique disclosed in the aforementioned Barnes application is also suitable to this embodiment.

It is noted that in dimensioning and positioning the reactive loading slots used to shift the resonant frequencies below the operating band, care must be taken so that the higher order resonances which will also be shifted downward will not reach the upper bound of the operating band. However, as used herein, the term resonant frequency or frequency of resonance, applies to any order resonance, and it is assumed in each case to be the resonance closest to the frequency band of interest. With the elimination of the interdependence of capacitance and resonance in accordance with the present invention, dimensioning of interdigital capacitors as needed to meet the requirements of an individual system, may be accomplished by anyone skilled in the art.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. A circuit for operating in a selected frequency band comprising, a circulator having an input port, output port, and a diode port; a diode oscillator coupled to the diode port; bias means for applying a dc bias to the diode oscillator; and means for blocking the dc bias from the input and output ports, characterized in that said means for blocking the dc bias includes at least one stripline interdigital capacitor coupled to one of the ports; said one capacitor including a conductor having two sets of interconnected conductive fingers interdigitated to form a gap between the fingers of the two sets; said gap having a length such that it is capable of supporting resonance at a first frequency; said one capacitor further including at least one slot within said conductor being coupled to the gap and dimensioned to extend the effective length of the gap so that the capacitor's resonance is shifted to a second frequency outside the selected frequency band.

2. A circuit as claimed in claim 1 wherein said means for blocking dc bias includes said one interdigital capacitor and another interdigital capacitor, said two capacitors being coupled individually to the input port and the output port of the circulator, and said two capacitors having different resonant frequencies.

3. A circuit as claimed in claim 2 wherein said one interdigital capacitor is dimensioned so that its resonance is at a frequency below said selected frequency band.

4. A circuit as claimed in claim 3 wherein the other of said interdigital capacitors is dimensioned so that its resonance is at a frequency above said selected frequency band.

5. A circuit as claimed in claim 1 wherein said means for blocking dc bias includes a single interdigital capacitor coupled to the diode port.

6. A circuit as claimed in claim 1 wherein said slot couples to the gap substantially at a voltage null of the standing wave pattern of the resonance being shifted.

7. A circuit as claimed in claim 6 wherein said slot couples to the center of the said gap to shift the frequency of a half-wave resonance.

8. A circuit as claimed in claim 6 wherein said slot couples to the gap at a point off the center of the gap to shift the frequency of a full-wave resonance.

9. A circuit as claimed in claim 1 wherein the portion of the conductor adjacent one set of fingers is broader than the portion adjacent the other set of fingers, and said slot is cut into the broader portion of the conductor.

10. A circuit for operating in a selected frequency band comprising, a circulator having an input port, an output port, and a diode port; a diode oscillator coupled to the diode port, bias means for applying a dc bias to the diode oscillator; a pair of stripline interdigital capacitors, one coupled to the input port and the other coupled to the output port, to block the dc bias from the input and output; each of said capacitors including a conductor having two sets of interconnected conductive fingers interdigitated to form a gap between the fingers of the two sets; said gap having a length such that it is capable of supporting resonance at a given frequency; and each of said capacitors being dimensioned so that it is resonant at a frequency different from the other.

* * * * *

UNITED STATES PATENT OFFICE
CERTIFICATE OF CORRECTION

Patent No. 3,820,041 Dated June 25, 1974

Inventor(s) James W. Gewartowski and Isamu Tatsuguchi

It is certified that error appears in the above-identified patent and that said Letters Patent are hereby corrected as shown below:

On the first page of the patent the heading should include

-- [73] Assignee: Bell Telephone Laboratories, Inc., Murray Hill, N.J. --.

Signed and sealed this 29th day of October 1974.

(SEAL)
Attest:

McCOY M. GIBSON JR.
Attesting Officer

C. MARSHALL DANN
Commissioner of Patents